(12) United States Patent
Huang et al.

(10) Patent No.: US 10,705,558 B2
(45) Date of Patent: Jul. 7, 2020

(54) APPARATUSES AND METHODS FOR AVOIDING GLITCHES WHEN SWITCHING CLOCK SOURCES

(71) Applicant: QUALCOMM Incorporated, San Diego, CA (US)

(72) Inventors: Yu Huang, San Diego, CA (US); Nam Dang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 53 days.

(21) Appl. No.: 15/967,344

(22) Filed: Apr. 30, 2018

(65) Prior Publication Data

US 2019/0332136 A1    Oct. 31, 2019

(51) Int. Cl.
*G06F 1/08*    (2006.01)
*G06F 1/06*    (2006.01)
*H03K 19/20*    (2006.01)

(52) U.S. Cl.
CPC ............ *G06F 1/08* (2013.01); *G06F 1/06* (2013.01); *H03K 19/20* (2013.01)

(58) Field of Classification Search
CPC ..................................... G06F 1/06; G06F 1/08
USPC ........................................................ 327/298
See application file for complete search history.

(56) References Cited

U.S. PATENT DOCUMENTS

| 5,155,380 | A | 10/1992 | Hwang et al. |
| 6,975,145 | B1 * | 12/2005 | Vadi .......................... G06F 1/04 |
| | | | 327/298 |
| 7,911,240 | B1 | 3/2011 | Lai et al. |
| 2007/0152719 | A1 | 7/2007 | Wu et al. |

OTHER PUBLICATIONS

International Search Report and Written Opinion—PCT/US2019/025713—ISA/EPO—dated Jul. 16, 2019.
Jovanovic et al. "Glitch Free Clock Switching Techniques in Modern Microcontrollers", Proceedings of the 5th Small Systems Simulation Symposium 2014, Nis, Serbia, Feb. 12-14, 2014, pp. 119-122.

* cited by examiner

*Primary Examiner* — Lincoln D Donovan
*Assistant Examiner* — Colleen J O Toole
(74) *Attorney, Agent, or Firm* — Patterson & Sheridan, L.L.P.

(57) ABSTRACT

Certain aspects of the present disclosure provide an input clock switching system, including: a clock source configured to output a reference clock signal; a clock generator circuit connected to the clock source and configured to output a plurality of input clock signals based on the reference clock signal; an output clock multiplexer, configured to: receive the plurality of input clock signals; receive an output clock selection signal; and output a first clock signal, wherein the first clock signal is one of the input clock signals; and a glitch suppression circuit, configured to: receive the first clock signal; receive a glitch suppression signal; output a clock output signal, wherein the clock output signal is: the first clock signal when the glitch suppression signal is in a first state; and a logic low signal when the glitch suppression signal is in a second state.

11 Claims, 5 Drawing Sheets

APPARATUSES AND METHODS FOR AVOIDING GLITCHES WHEN SWITCHING CLOCK SOURCES

INTRODUCTION

Aspects of the present disclosure relate to apparatuses and methods for avoiding glitches when switching clock sources.

Electronic devices frequently rely on multiple clock signals (e.g., at different frequencies). For example, digital circuits used in microprocessors often have the capacity to select from a variety of available clock signals in order to match processing rate with demand while saving power when demand is reduced. Similarly, communications circuitry often relies on a variety of different frequency clock signals to create transmission and reception frequencies across different radio technologies (e.g., cellular and Bluetooth). In fact, generation and consumption of multiple clock signals is nearly ubiquitous in modern electronic devices.

One simple type of clock switch is a multiplexer circuit, which takes two or more clock signal sources as inputs and includes selection circuitry to choose from the clock signal sources a single output. In some cases the clock signals are related (e.g., multiples of each other), while in others they may be completely unrelated. In either case, there is a chance of generating a glitch or chopped signal on the clock output line when one clock signal (e.g., at a first frequency) is changed to another clock signal (e.g., at a second frequency). Some applications require output signal to be glitch-free during inputs switching.

Accordingly, there is a need for clock switching solutions that avoid glitches when transitioning from one clock source signal to another.

BRIEF SUMMARY

A first embodiment is directed to an input clock switching system, including: a clock source configured to output a reference clock signal; a clock generator circuit connected to the clock source and configured to output a plurality of input clock signals based on the reference clock signal; an output clock multiplexer, configured to: receive the plurality of input clock signals; receive an output clock selection signal; and output a first clock signal, wherein the first clock signal is one of the input clock signals; and a glitch suppression circuit, configured to: receive the first clock signal; receive a glitch suppression signal; output a clock output signal, wherein the clock output signal is: the first clock signal when the glitch suppression signal is in a first state; and a logic low signal when the glitch suppression signal is in a second state.

A second embodiment is directed to a method for suppressing glitches during switches between clock input sources, including: outputting a first clock signal; receiving a signal to switch from a first clock signal to a second clock signal; suppressing a glitch during a transition between the first clock signal and the second clock signal; and outputting the second clock signal.

A third embodiment is directed to an apparatus, including: a clock switching circuit comprising a glitch suppression circuit, wherein the clock switching circuit is configured to: output a first clock signal; receive a signal to switch from a first clock signal to a second clock signal; suppress a glitch during a transition between the first clock signal and the second clock signal; and output the second clock signal.

The following description and the related drawings set forth in detail certain illustrative features of one or more embodiments.

BRIEF DESCRIPTION OF THE DRAWINGS

The appended figures depict certain aspects of the one or more embodiments and are therefore not to be considered limiting of the scope of this disclosure.

To facilitate understanding, identical reference numerals have been used, where possible, to designate identical elements that are common to the drawings. It is contemplated that elements and features of one embodiment may be beneficially incorporated in other embodiments without further recitation.

DETAILED DESCRIPTION

Aspects of the present disclosure provide apparatuses, methods, processing systems, and computer readable mediums for avoiding glitches when switching clock sources.

To solve the problem of glitches produced when switching between multiple inputs, especially by way of multiplexers, a glitch suppression circuit element may be added to a switching circuit, such as a clock switching circuit. In general terms, the glitch suppression circuit may be configured to output either a currently selected input from a multiplexer or the output may be tied to a ground to pull the resulting output signal low. Because many clock signals alternate between logical high (e.g., '1') and logical low (e.g., '0'), connecting an output signal line to ground may emulate a logical low during a time interval. Moreover, the glitch suppression circuit may be compared to a logic circuit element so that the suppression of glitches is automatically achieved with minimal additional circuitry. The suppression of glitches by way of a glitch suppression circuit provides a wider range of functional capabilities to the encompassing switching circuit. For example, a switching circuit including the glitch suppression circuit may be useable for applications sensitive to glitches in reference signals, such as clock signals.

Conventional Clock Switching Circuits

Figure 1A:
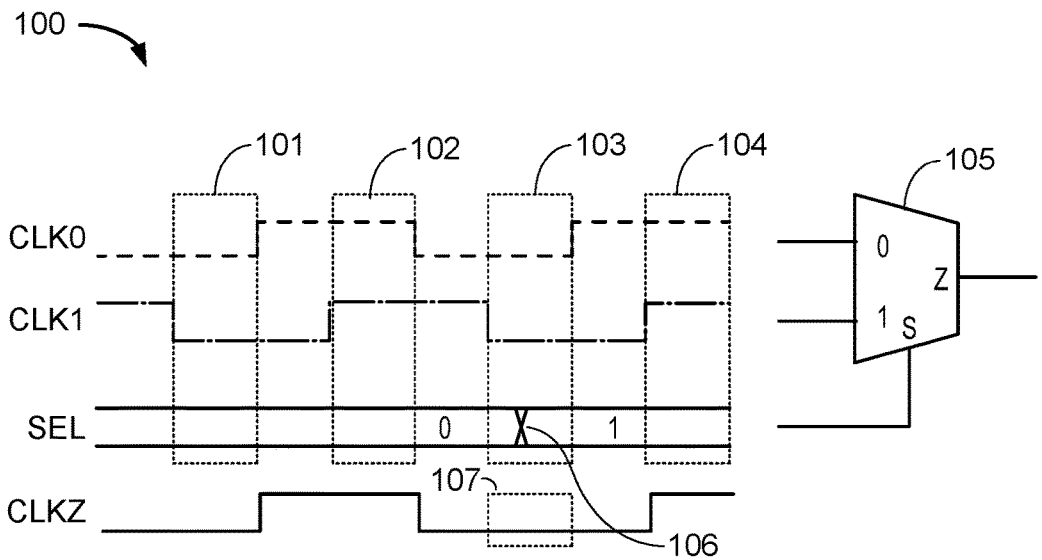
FIG. 1A depicts an example of a clock switching circuit with two correlated input clock sources.

FIG. 1A depicts an example of a clock switching circuit 100 with two correlated input clock sources (CLK0 and CLK1) and a multiplexer (i.e., mux) 105. Mux 105 includes inputs of CLK0 and CLK1 and a selection line (SEL). Mux 105 also includes an output of CLKZ, i.e., the selected clock signal from CLK0 and CLK1. Here, the clock sources (CLK0 and CLK1) are described as correlated because they are the same signal merely shifted in phase. In other words, one signal follows the other, but with a phase delay.

Mux 105 only needs a single selection bit to choose between the clock input sources (i.e., CLK0 and CLK1) because there are only two input sources. Thus, the switch between one clock and another requires switching between only two states in mux 105, which means the switch may happen nearly instantaneously. However, as described below with respect to FIG. 1B, this is not always the case.

As depicted in FIG. 1A, there are a plurality of switching windows 101-104 where the clock input can be switched without creating an output glitch because during switching windows 101-104, CLK0 and CLK1 have the same state (e.g., high or low). Thus, in this arrangement, there always exists an opportunity to switch between any of the available clock sources (here, CLK0 and CLK1) without creating an output glitch on CLKZ.

For example, as depicted in the CLKZ output signal trace, mux 105 changes the selection of clock sources from CLK0 to CLK1 at time 106, but because time 106 is within switching window 103 (where CLK0 and CLK1 are at that same state), no output glitch is created in the CLKZ output signal during the switch (as shown in box 107).

Figure 1B:
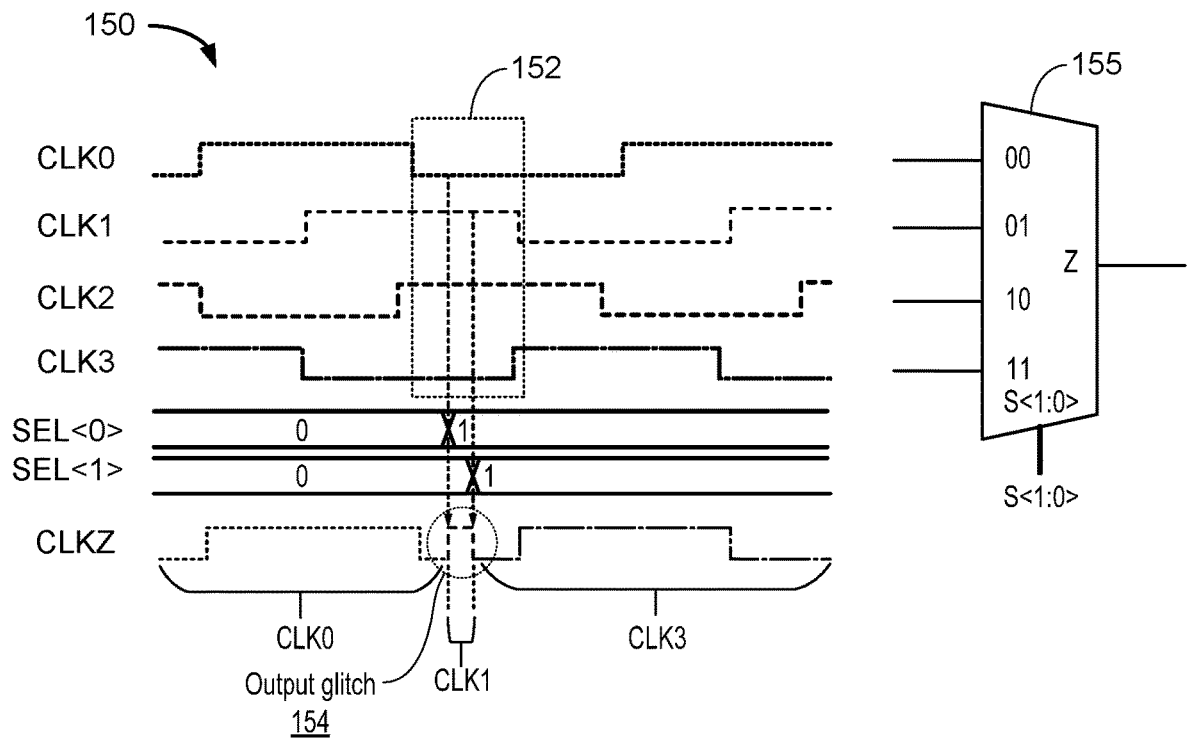
FIG. 1B depicts an example of a clock switching system with four correlated input clock sources.

FIG. 1B depicts an example of a clock switching circuit 150 with four correlated input clock sources (CLK0, CLK1, CLK2, and CLK3) and a mux 155. Mux 155 includes inputs of CLK0, CLK1, CLK2, and CLK3 and a selection input (SEL). Mux 155 also includes an output of CLKZ, i.e., the selected clock signal from CLK0, CLK1, CLK2, and CLK3.

FIG. 1B reveals several challenges with clock switching between more than just two sources. First, unlike in FIG. 1A, here there is no window of time where all four clock input signals (CLK0, CLK1, CLK2, and CLK3) are in the same state (e.g., high or low). As depicted in window 152, there is always at least one clock input signal that is different than the others. Consequently, while it is possible to switch from some clock input sources to others without a glitch (where those clock input sources are in the same state), it is not possible to switch between all clock input sources without a glitch.

Second, because there are more than two clock input sources, more than one input selection bit is necessary. As depicted in FIG. 1B, there is a period of time necessary to shift in each selection bit, which is shown by the time offset between SEL<0> and SEL<1>. The offset in time means that the actual output selected may temporarily transition to an unselected input. For example, CLK0 is selected with selection bits "00". In order to select CLK3, two '1' bits must be shifted in to mux 155. Thus, the actual output selection goes from "00" (CLK0) to "01" (CLK1) while shifting the first bit (1') in, and to "11" (CLK3) while shifting the second bit (1') in. The temporary selection of CLK1 in this case during the transition from CLK0 to CLK 3 creates an output glitch 154. Output glitch 154 may cause errors in other circuits or applications relying on clock switching circuit 150.

Glitch Free Conventional Clock Switching Circuits

Figure 2:
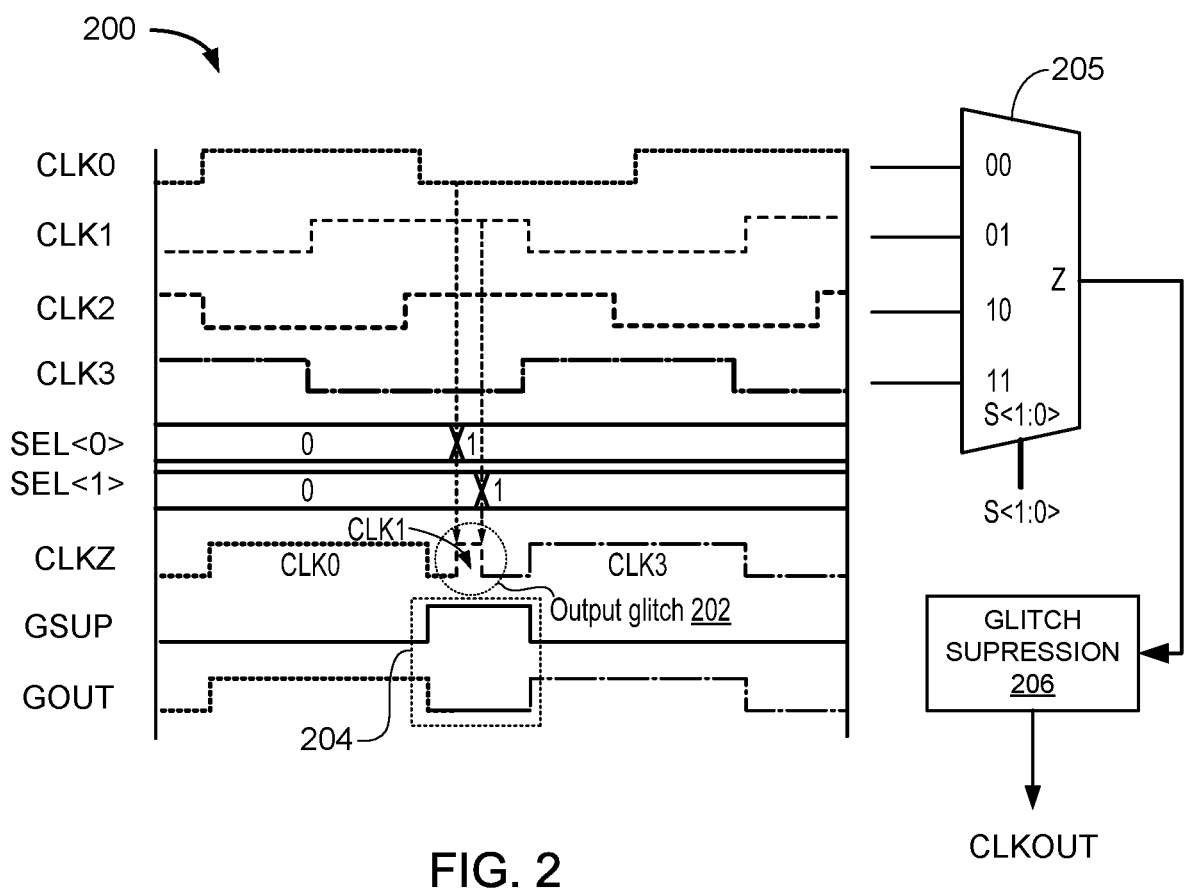
FIG. 2 depicts an example of a clock switching circuit with a glitch suppression system.

FIG. 2 depicts an example of a clock switching circuit 200 with a glitch suppression element 206. Similar to FIG. 1B, here clock switching circuit 200 includes four input clock sources (CLK0, CLK1, CLK2, and CLK3) and a multiplexer (i.e., mux) 205. Mux 205 includes inputs of CLK0, CLK1, CLK2, and CLK3 and a selection input (SEL). Mux 205 also includes an output of CLKZ, i.e., the selected clock signal from CLK0, CLK1, CLK2, and CLK3.

The selection of a clock input signal in FIG. 2 works much the same way as described in FIG. 1B. However, here the output (CLKZ) goes to a glitch suppression element 206. Glitch suppression element 206 includes logic that suppresses glitch 202 during the switch from (in this example) CLK0 to CLK3. For example, the suppression logic may be as follows:

| Glitch Suppression Element Input Logic | Glitch Suppression Element Output |
| --- | --- |
| 0/Logic Low | Input Signal |
| 1/Logic High | 0/Logic Low |

As above, when the input logic to glitch suppression element 206 is '0' (e.g., logic 0 or logic low), the output from glitch suppression element 206 is the input signal, which in this case is the output signal (CLKZ) from mux 205. When the input logic to glitch suppression element 206 is '1' (e.g., logic 1 or logic high), the output from glitch suppression unit 206 is '0' (e.g., logic 0 or logic low).

As shown in FIG. 2, glitch suppression element 206 outputs a signal (CLKOUT) that goes low while the glitch suppression input signal (GSUP) is high during window 204. Consequently, output glitch 202 is suppressed from the ultimate output of clock switching circuit 200.

Figure 3A:
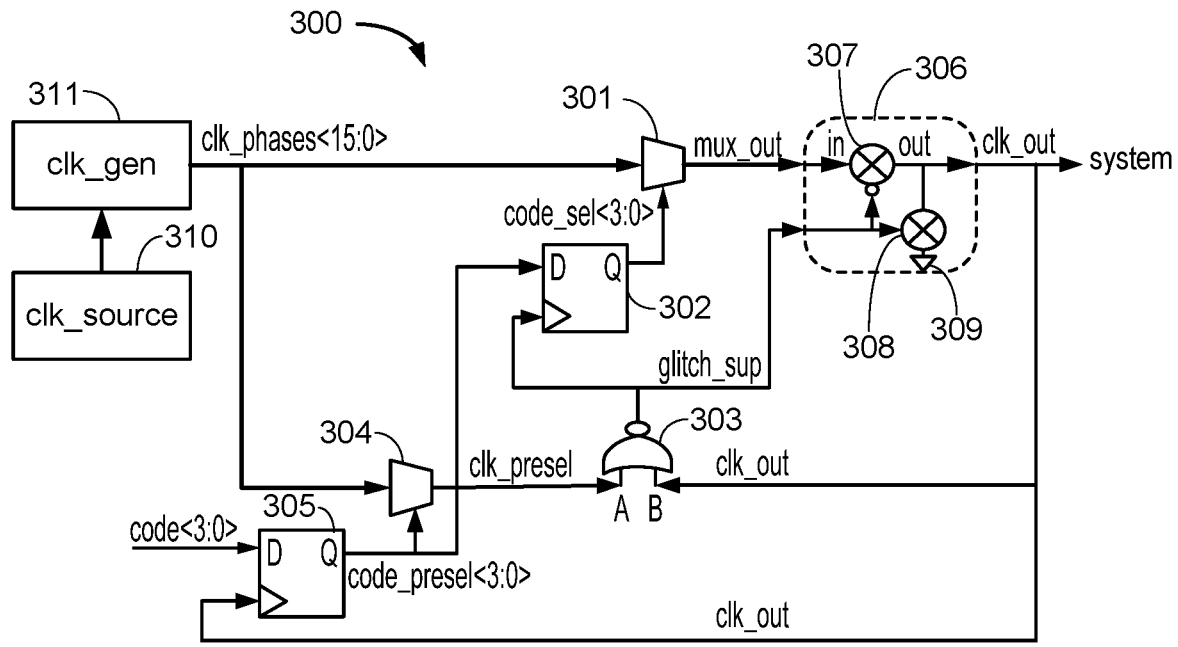
FIG. 3A depicts an example clock switching circuit diagram with a glitch suppression circuit.

FIG. 3A depicts an example clock switching circuit 300 with a glitch suppression circuit 306.

Clock switching circuit 300 includes a clock source (clk_source) 310 configured to output a reference clock signal. For example, clock source 310 may be a crystal oscillator.

The output of clock source 310 is connected to an input of clock generator circuit (clk_gen) 311. Clock generator circuit 311 is configured to output a plurality of input clock signals (clk_phases<15:0>) based on the reference clock signal from clock source 310. For example, clock generator circuit 311 may include one or more phased locked loops (PLLs) to generate the plurality of input clock signals from a reference clock signal.

The output of clock generator circuit 311 is connected to an input of output clock multiplexer 301. Output clock multiplexer 301 is configured to receive the plurality of input clock signals (clk_phases<15:0>) and select between them based on an output clock selection signal (code_sel<3:0>) from latch 302. Output clock multiplexer 301 is configured to output a clock signal selected (mux_out) from one of the plurality of input clock signals (clk_phases<15:0>) to glitch suppression circuit 306.

Glitch suppression circuit 306 has an input connected to output clock multiplexer 301 and configured to receive the selected clock signal (mux_out) from output clock multiplexer 301. Glitch suppression circuit 306 has another input connected to the output of logic gate 303 and is configured to receive a glitch suppression signal from logic gate 303. Glitch suppression circuit 306 includes an output that is connected to logic gate 303 and latch 310 as well as to other system elements (e.g., in an electronic device) that rely on a clock signal from clock switching circuit 300.

In this example, glitch suppression circuit 306 has two inputs: the selected clock signal from output clock multiplexer 301 (mux_out) and the glitch suppression signal (glitch_sup) from logic gate 303. And in this example glitch suppression circuit 306 has one output, which is based on its two inputs, and the following example logic:

| Glitch Suppression Circuit Input Logic | Glitch Suppression Circuit Output |
|---|---|
| glitch_sup = 0/Logic Low | clk_out = mux_out |
| glitch_sup = 1/Logic High | clk_out = 0/Logic Low |

More specifically, in this example, glitch suppression circuit 306 includes a first transmission gate 307 and a second transmission gate 308. First transmission gate 307 has an input connected to the output of output clock multiplexer 301 and configured to receive the selected clock signal (mux_out) from output clock multiplexer 301. First transmission gate 307 has another input connected to the output of logic gate 303 and configured to receive a glitch suppression signal (glitch_sup). First transmission gate 307 has an output connected to the output of glitch suppression circuit 306. First transmission gate 307 is configured to output the selected clock signal from output clock multiplexer 301 (mux_out) when the glitch suppression signal (glitch_sup) from logic gate 303 is '0' (e.g., logic 0 or logic low). First transmission gate 307 is configured to block the selected clock signal from output clock multiplexer 301 (mux_out) when the glitch suppression signal (glitch_sup) from logic gate 303 is '1' (e.g., logic 1 or logic high). In some embodiments, first transmission gate 307 may be a three-state or tri-state circuit element, which allows an output port to assume a high impedance state, effectively removing the output from the circuit, in addition to other functional states.

Second transmission gate 308 has an input connected to the output of logic gate 303 and configured to receive a glitch suppression signal (glitch_sup). Second transmission gate 308 has a second input connected to ground 309. Second transmission gate 308 has an output connected to the output of glitch suppression circuit 306. Second transmission gate 308 is configured to connect the output of glitch suppression circuit 306 to ground 309 when the glitch suppression signal (glitch_sup) from logic gate 303 is '1' (e.g., logic 1 or logic high). Second transmission gate 308 is configured to block the ground when the glitch suppression signal (glitch_sup) from logic gate 303 is '0' (e.g., logic 0 or logic low). As with first transmission gate 307, in some embodiments, second transmission gate 308 may be a three-state or tri-state circuit element.

Clock switching circuit 300 also includes latch 305, which has a first input for receiving a signal (code<3:0>) for selecting a new clock input signal. Latch 305 includes a second input connected to the output of glitch suppression circuit 306 and configured to receive an output clock signal (clk_out) from glitch suppression circuit 306. The output of latch 305 is connected to an input of clock preselection multiplexer 304. Latch 305 is configured to output a clock preselection signal (code_presel1<3:0>) to clock preselection multiplexer 304.

Clock preselection multiplexer 304 includes an input connected to latch 305 and configured to receive the preselected clock signal (code_presel1<3:0>) as well as an input connected to clock generator circuit 311. Thus, clock preselection multiplexer 304 is also configured to receive the plurality of input clock signals (clk_phases<15:0>) from clock generator circuit 311. Based on the preselected clock signal (code_presel<3:0>), clock preselection multiplexer 304 outputs a preselected clock signal (clk_presel) to logic gate 303.

Logic gate 303 includes an input for the preselected clock signal (clk_presel) output from clock preselection multiplexer 304 and an input for the clock signal (clk_out) output from glitch suppression circuit 306. In this example, logic gate 303 is a NOR gate (i.e., a digital logic gate that gives a '1' (e.g., logic 1 or logic high) output when both inputs are '0'). However, in other embodiments, logic gate 303 may comprise one or more other types of logic gates, such as NAND, XNOR, XOR, with appropriate changes to the inputs for the same functional output. In this case, if the preselected clock signal (clk_presel) and the clock output signal (clk_out) from glitch suppression circuit 306 are both '1' (e.g., logic 1 or logic high), or if they do not match (e.g., '1' and '0'), then the output of logic gate 303 is '0' (e.g., logic 0 or logic low), whereas if the preselected clock signal (clk_presel) and the clock output signal (clk_out) from glitch suppression circuit 306 are both '0', then the output of logic gate 303 is '1' (e.g., logic 1 or logic high).

Clock switching circuit 300 also includes a latch 302, which has an input for receiving a preselected clock signal (code_presel<3:0>) for selecting a new clock input signal. Latch 302 also includes an input connected to the output of logic gate 303 and configured to receive the glitch suppression signal (glitch_sup) from logic gate 303. The output of latch 302 is connected to an input of output clock multiplexer 301. Latch 302 is configured to output an output clock selection signal (code_sel<3:0>) to clock output multiplexer 301.

Figure 3B:
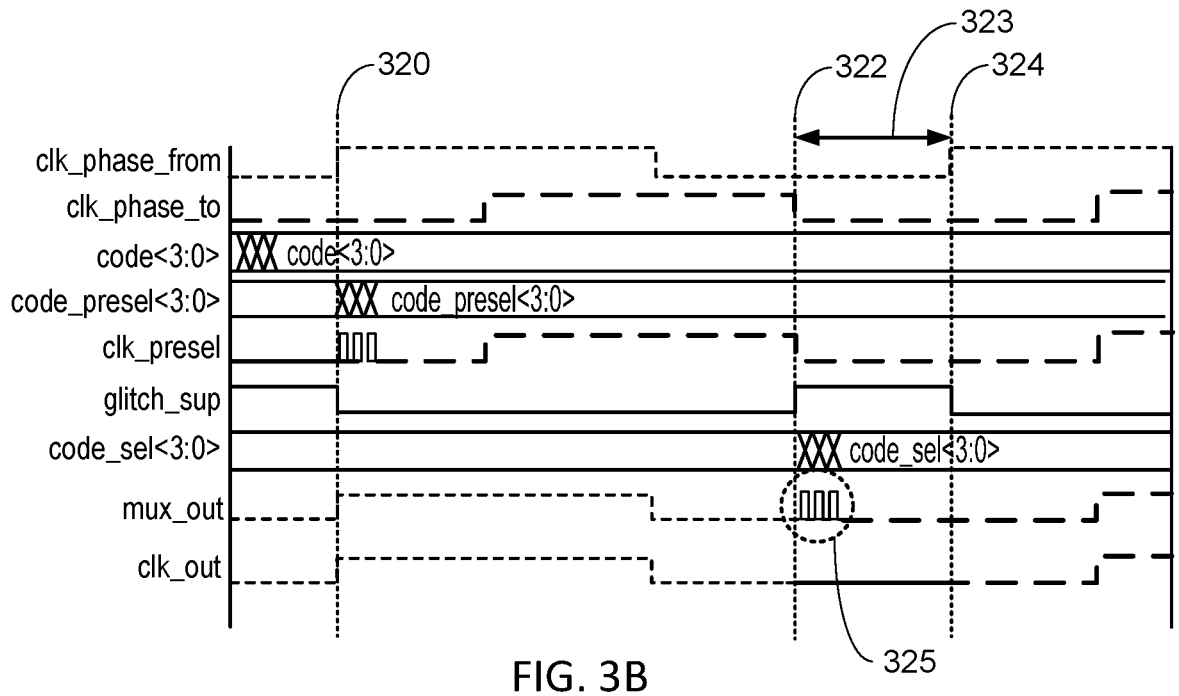
FIG. 3B depicts a set of example input signals for the clock switching circuit of FIG. 3A.

The operation of clock switching circuit 300 is demonstrated in one example in FIG. 3B. In particular, in this example a first clock signal (clk_phase_from) is switched to a second clock signal (clk_phase_to). In this example, the clock signals are correlated and in different phases; however, in other examples the clock signals may be uncorrelated.

Initially, a signal for selecting a new clock input signal (code<3:0>) is received by latch 305 in FIG. 3A. At time 320, the output clock signal (clk_out), which is following "clk_phase_from," switches and prompts the latching of the signal (code<3:0>) into the clock preselection multiplexer 304 in FIG. 3A. The preselected clock signal (clk_presel) then begins to follow a second clock signal (clk_phase_to).

Time 322 begins a switching window 323 because both the output clock signal (clk_out), which is following "clk_phase_from," and the preselected clock signal (clk_presel), which is following "clk_phase_to," are both '0' (e.g., logic 0 or logic low). During switching window 323, logic gate 303, which in this example is a NOR gate, outputs a glitch suppression signal (glitch_sup) of '1' (e.g., logic 1 or logic high) because the existing output clock signal (clk_out) and the preselected clock signal (clk_presel) are both '0'. Consequently, during switching window 323, the output clock signal (clk_out) goes to '0' by action of the glitch suppression circuit, which is tying the output clock signal (clk_out) to ground during this time. Thus, the action of the glitch suppression circuit prevents the glitches 325 in the clock multiplexer output signal (mux_out) signal from affecting the output clock signal (clk_out).

At time 324, the output clock signal (clk_out) is now following the preselected clock signal (clk_presel), which is following "clk_phase_to." Thus, a switch between two clock signals is accomplished without any output clock signal glitches. Note that while FIG. 3B is depicted with only a first clock signal "clk_phase_from" and a second clock signal "clk_phase_to" that have a switching window, the same method works where the first and second signal are separated by intermediate signals such that no switching window exists for all signals (as discussed above with respect to FIG. 1B). As shown in FIG. 1B, the existing signal (CLK0) and the selected signal (CLK3) have a switching window where both signals are '0', which would activate the glitch suppression signal and suppress any output glitch (such as 154 in FIG. 1B) while transitioning between selected signals.

Figure 4:
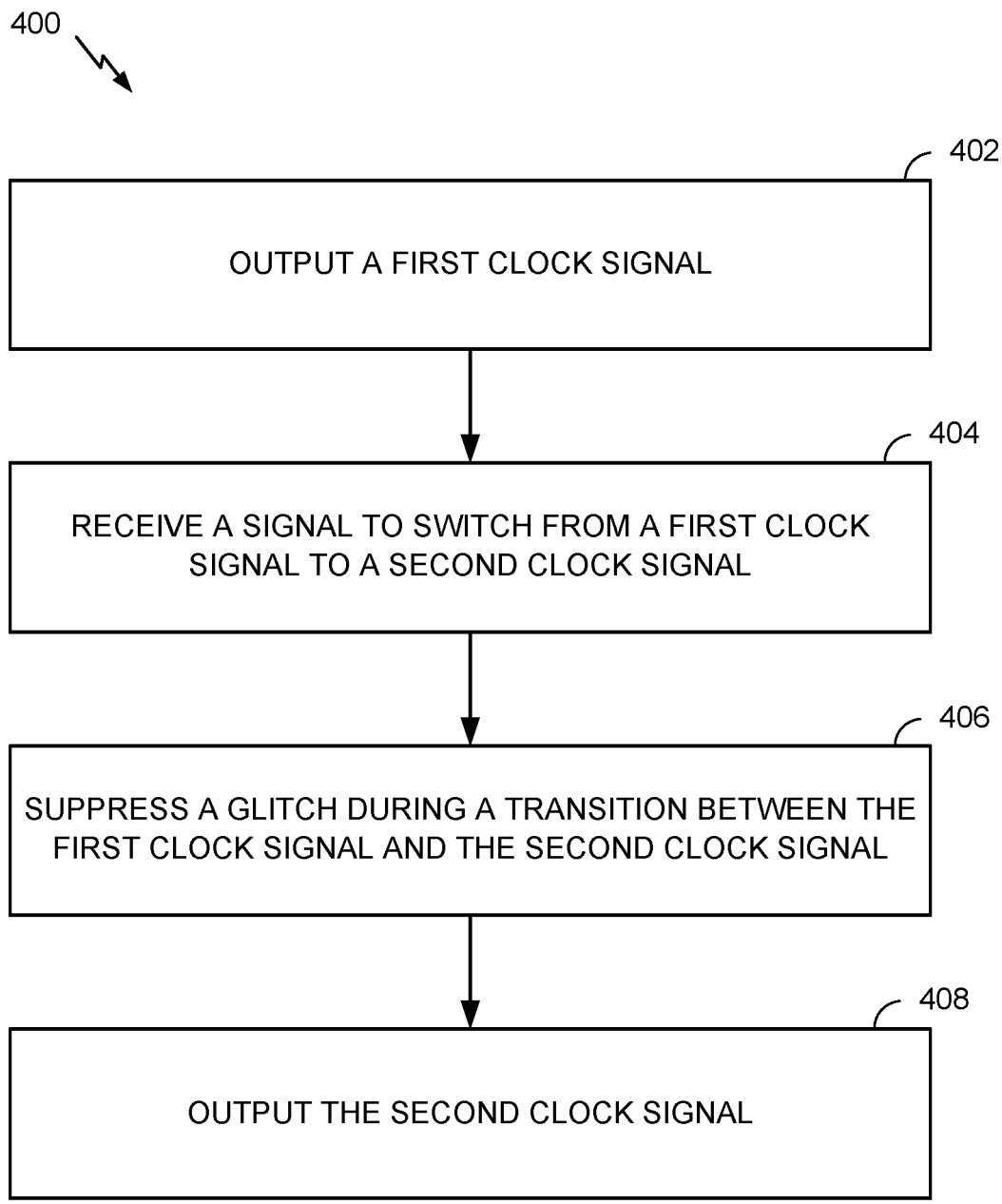
FIG. 4 depicts an example method for suppressing glitches during switches between clock input sources.

FIG. 4 depicts an example method 400 for suppressing glitches during switches between clock input sources. The method begins at step 402 with a first clock signal (e.g., in a first phase) is output. For example, a first signal may be output from a clock switching circuit, such as described above with respect to FIGS. 2 and 3B.

Method 400 then proceeds to step 404 where a signal to switch from a first clock signal to a second clock signal is received. For example, the signal may be a signal for selecting a new clock input signal as discussed with respect to latch 305 in FIG. 3A.

Method 400 then proceeds to step 406 where a glitch is suppressed during a transition between the first clock signal and the second clock signal. For example, as described above with respect to FIGS. 2 and 3B, the glitch is suppressed by a signal output from a glitch suppression element (e.g., a circuit). In some examples, suppressing the glitch during the transition between the first clock signal and the second clock signal includes outputting a logic low signal, such as described with respect to FIGS. 2 and 3B. Further, in some examples, outputting the logic low signal comprises connecting an output of a glitch suppression circuit to a ground, as described with respect to FIG. 3A.

Method 400 then proceeds to step 408 where the second clock signal is output. For example, a second clock signal (e.g., in a second phase) may be output from a clock switching circuit, such as described above with respect to FIGS. 2 and 3B.

Though not shown in FIG. 4, in some examples method 400 also includes determining that the first clock signal and the second clock signal are in different states. Further, in some examples, method 400 includes receiving the glitch suppression signal from a logic gate.

Figure 5:
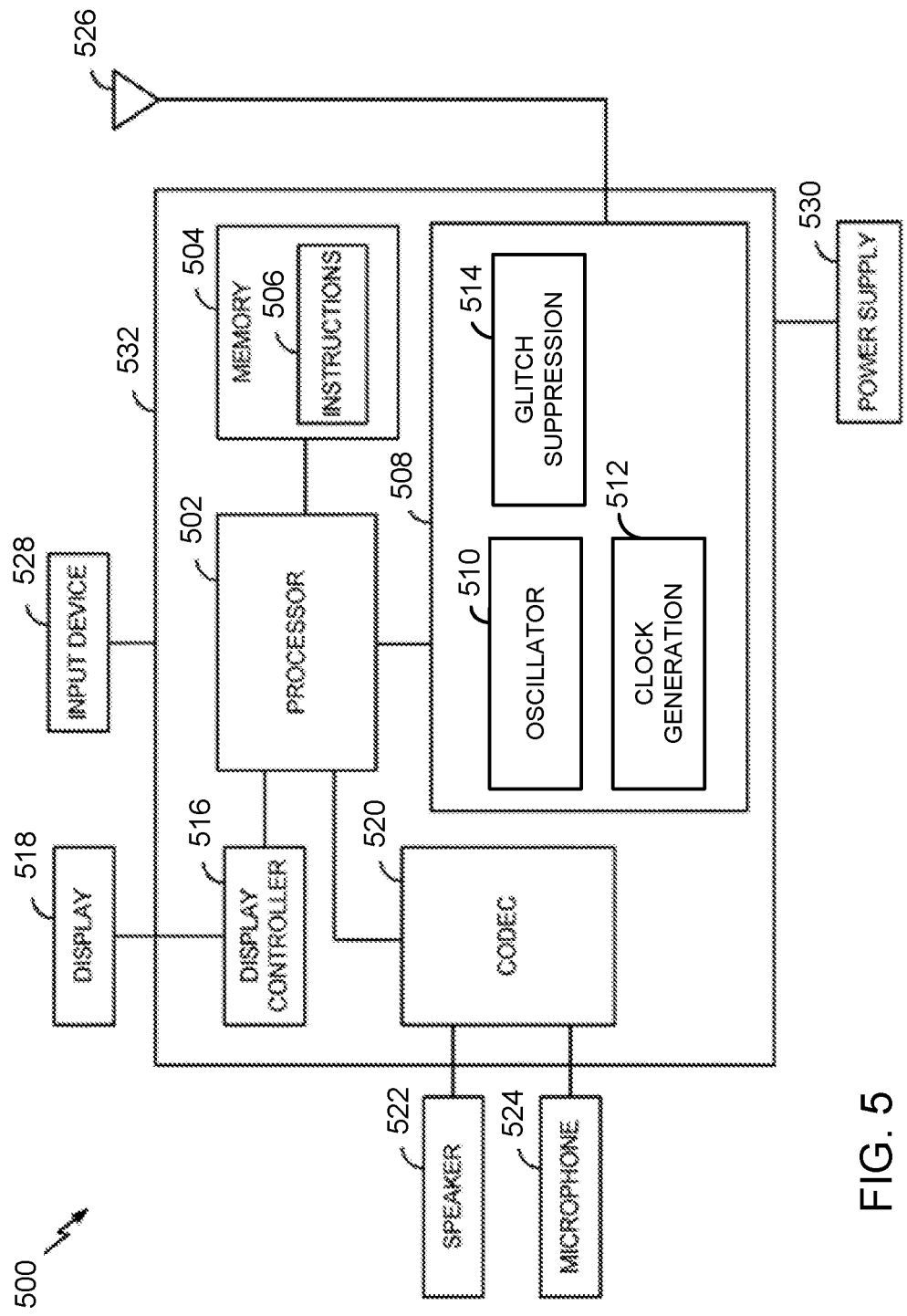
FIG. 5 depicts an example processing system configured to implement a method for suppressing glitches during switches between clock input sources.

FIG. 5 depicts a block diagram of an example of an electronic device 500, which may use a clock switching circuit as described with respect to FIGS. 2, 3A, and 3B. The electronic device 500 may correspond to a mobile device (e.g., a cellular telephone), as an illustrative example. In other implementations, the electronic device 500 may correspond to a computer (e.g., a server, a laptop computer, a tablet computer, or a desktop computer), an access point, a base station, a wearable electronic device (e.g., a personal camera, a head-mounted display, or a watch), a vehicle control system or console, a home appliance, a set top box, an entertainment unit, a navigation device, a personal digital assistant (PDA), a television, a monitor, a tuner, a radio (e.g., a satellite radio), a music player (e.g., a digital music player or a portable music player), a video player (e.g., a digital video player, such as a digital video disc (DVD) player or a portable digital video player), a robot, a healthcare device, another electronic device, or a combination thereof.

The electronic device 500 includes a processor 502. The processor 502 may include a digital signal processor (DSP), a central processing unit (CPU), a graphics processing unit (GPU), another processing device, or a combination thereof.

The electronic device 500 may further include a memory 504. The memory 504 may be coupled to or integrated within the processor 502. The memory 504 may store instructions 506 that are executable by the processor 502. To further illustrate, the memory 604 may include random access memory (RAM), magnetoresistive random access memory (MRAM), flash memory, read-only memory (ROM), programmable read-only memory (PROM), erasable programmable read-only memory (EPROM), electrically erasable programmable read-only memory (EEPROM), one or more registers, a hard disk, a removable disk, a compact disc read-only memory (CD-ROM), another storage device, or a combination thereof.

The electronic device 500 may further include a clock switching circuit 508 as described above with respect to FIGS. 2 and 3A-3B. In this example, clock switching circuit 508 includes an oscillator 510, a clock generation unit 512, and a glitch suppression unit 514, as described above with respect to FIGS. 2 and 3A-3B.

FIG. 5 also shows a display controller 516 that is coupled to the processor 502 and to a display 518. A coder/decoder (CODEC) 520 can also be coupled to the processor 502. A speaker 522 and a microphone 524 can be coupled to the CODEC 520. FIG. 5 also indicates that an antenna 526 may be coupled to a transceiver (not shown).

Further, an input device 528 and a power supply 530 may be coupled to, for example, a PCB device 532. Moreover, in a particular example, as illustrated in FIG. 5, the display 518, the input device 528, the speaker 522, the microphone 524, the antenna 526, and the power supply 530 are external to the PCB 532. However, each of the display 518, the input device 528, the speaker 636, the microphone 638, the antenna 642, and the power supply 644 can be coupled to a component of the PCB device 532, such as to an interface or to a controller.

The preceding description provides examples, and is not limiting of the scope, applicability, or embodiments set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

The preceding description is provided to enable any person skilled in the art to practice the various embodiments described herein. Various modifications to these embodiments will be readily apparent to those skilled in the art, and the generic principles defined herein may be applied to other embodiments. For example, changes may be made in the function and arrangement of elements discussed without departing from the scope of the disclosure. Various examples may omit, substitute, or add various procedures or components as appropriate. Also, features described with respect to some examples may be combined in some other examples. For example, an apparatus may be implemented or a method may be practiced using any number of the aspects set forth herein. In addition, the scope of the disclosure is intended to cover such an apparatus or method that is practiced using other structure, functionality, or structure and functionality in addition to, or other than, the various aspects of the disclosure set forth herein. It should be understood that any aspect of the disclosure disclosed herein may be embodied by one or more elements of a claim.

As used herein, the word "exemplary" means "serving as an example, instance, or illustration." Any aspect described herein as "exemplary" is not necessarily to be construed as preferred or advantageous over other aspects.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The methods disclosed herein comprise one or more steps or actions for achieving the methods. The method steps and/or actions may be interchanged with one another without departing from the scope of the claims. In other words, unless a specific order of steps or actions is specified, the order and/or use of specific steps and/or actions may be modified without departing from the scope of the claims. Further, the various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

A processing system may be implemented with a bus architecture. The bus may include any number of interconnecting buses and bridges depending on the specific application of the processing system and the overall design constraints. The bus may link together various circuits including a processor, machine-readable media, and input/output devices, among others. A user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer-readable medium. Software shall be construed broadly to mean instructions, data, or any combination thereof, whether referred to as software, firmware, middleware, microcode, hardware description language, or otherwise. Computer-readable media include both computer storage media and communication media, such as any medium that facilitates transfer of a computer program from one place to another. The processor may be responsible for managing the bus and general processing, including the execution of software modules stored on the computer-readable storage media. A computer-readable storage medium may be coupled to a processor such that the processor can read information from, and write information to, the storage medium. In the alternative, the storage medium may be integral to the processor. By way of example, the computer-readable media may include a transmission line, a carrier wave modulated by data, and/or a computer readable storage medium with instructions stored thereon separate from the wireless node, all of which may be accessed by the processor through the bus interface. Alternatively, or in addition, the computer-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module, it will be understood that such functionality is implemented by the processor when executing instructions from that software module.

The following claims are not intended to be limited to the embodiments shown herein, but are to be accorded the full scope consistent with the language of the claims. Within a claim, reference to an element in the singular is not intended to mean "one and only one" unless specifically so stated, but rather "one or more." Unless specifically stated otherwise, the term "some" refers to one or more. No claim element is to be construed under the provisions of 35 U.S.C. § 112(f) unless the element is expressly recited using the phrase "means for" or, in the case of a method claim, the element is recited using the phrase "step for." All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims.

What is claimed is:

1. An input clock switching system, comprising:
a clock source configured to output a reference clock signal;
a clock generator circuit connected to the clock source and configured to output a plurality of input clock signals based on the reference clock signal;
a first latch, configured to:
receive a selection code; and
receive a clock output signal; and
output an input clock selection signal;
a clock preselection multiplexer, configured to:
receive the plurality of input clock signals;
receive the input clock selection signal; and
output a preselected clock signal;
a second latch, configured to:
receive the input clock selection signal;
receive a glitch suppression signal; and
output an output clock selection signal
an output clock multiplexer, configured to:
receive the plurality of input clock signals;
receive the output clock selection signal; and
output a selected clock signal, wherein the selected clock signal is one of the plurality of input clock signals; and
a logic gate, configured to:
receive the preselected clock signal;
receive the clock output signal; and
output the glitch suppression signal based on the preselected clock signal and the clock output signal; and
a glitch suppression circuit, configured to:
receive the selected clock signal from the output clock multiplexer;
receive the glitch suppression signal from the logic gate; and
output the clock output signal, wherein the clock output signal is:
the selected clock signal when the glitch suppression signal is in a first state; and
a logic low signal when the glitch suppression signal is in a second state.

2. The input clock switching system of claim 1, wherein the glitch suppression circuit comprises:
a first transmission gate, configured to:
receive the selected clock signal;
receive the glitch suppression signal; and
output the selected clock signal if the glitch suppression signal is in the first state; and
a second transmission gate, configured to:
receive the glitch suppression signal; and
output the logic low signal when the glitch suppression signal is in the second state.

3. The input clock switching system of claim 1, wherein the logic gate is a NOR gate.

4. The input clock switching system of claim 1, wherein the first state is a logic low state and the second state is a logic high state.

5. A method for suppressing glitches during switches between clock input sources, comprising:
outputting a first clock signal;
receiving a signal to switch from the first clock signal to a second clock signal;
suppressing a glitch during a transition between the first clock signal and the second clock signal by:
receiving, at a first latch, a selection code;
receiving, at the first latch, a clock output signal;
outputting, from the first latch, an input clock selection signal;
receiving, at a clock preselection multiplexer, a plurality of input clock signals from a clock generator circuit;
receiving, at the clock preselection multiplexer, the input clock selection signal;
outputting, from the clock preselection multiplexer, a preselected clock signal;
receiving, at a second latch, the input clock selection signal;
receiving, at the second latch, a glitch suppression signal;
outputting, from the second latch, and output clock selection signal;
receiving, at an output clock multiplexer, the plurality of input clock signals from a clock signal generator;
receiving, at the output clock multiplexer, the output clock selection signal;
outputting, from the output clock multiplexer, a selected clock signal, wherein the selected clock signal is one of the plurality of input clock signals;
receiving, at a logic gate, the preselected clock signal;
receiving, at the logic gate, the clock output signal;
outputting, from the logic gate, the glitch suppression signal based on the preselected clock signal and the clock output signal;
receiving, at a glitch suppression circuit, the selected clock signal from the output clock multiplexer;
receiving, at the glitch suppression circuit, the glitch suppression signal from the logic gate;
outputting, from the glitch suppression circuit, the selected clock signal when the glitch suppression signal is in a first state;
outputting, from the glitch suppression circuit, a logic low signal when the glitch suppression signal is in a second state; and
outputting the second clock signal, wherein the second clock signal is the selected clock signal.

6. The method of claim 5, further comprising: determining that the first clock signal and the second clock signal are in different states.

7. The method of claim 5, wherein outputting the logic low signal comprises connecting an output of the glitch suppression circuit to a ground.

8. An apparatus, comprising:
a clock switching circuit comprising a glitch suppression circuit, wherein the clock switching circuit is configured to:
output a first clock signal;
receive a signal to switch from the first clock signal to a second clock signal;
suppress a glitch during a transition between the first clock signal and the second clock signal; and
output the second clock signal, wherein the glitch suppression circuit comprises:
   a first transmission gate, configured to:
      receive the first clock signal;
      receive a glitch suppression signal from a NOR logic gate; and
      output the first clock signal if the glitch suppression signal is in a first state; and
   a second transmission gate, configured to:
      receive the glitch suppression signal from the NOR logic gate; and
      output a logic low signal when the glitch suppression signal is in a second state.

9. The apparatus of claim 8, wherein the clock switching circuit is further configured to: determine that the first clock signal and the second clock signal are in different states.

10. The apparatus of claim 8, wherein in order to suppress the glitch during the transition between the first clock signal and the second clock signal, the glitch suppression circuit is configured to: output the logic low signal.

11. The apparatus of claim 8, wherein in order to output the logic low signal, the glitch suppression circuit is configured to: connect an output of the glitch suppression circuit to a ground.

* * * * *